United States Patent [19]

Kawamoto et al.

[11] 3,848,196

[45] Nov. 12, 1974

[54] BROADBAND TRAPATT DIODE AMPLIFIER

[75] Inventors: Hirohisa Kawamoto, Kendall Park, N.J.; Elmer Lawrence Allen, Jr., Philadelphia, Pa.; Sherman Weisbrod, Trenton, N.J.

[73] Assignee: RCA Corporation, New York, N.Y.

[22] Filed: Nov. 8, 1973

[21] Appl. No.: 413,825

[52] U.S. Cl. .................... 330/34, 330/5, 333/84 M

[51] Int. Cl. .......................................... H03b 7/14

[58] Field of Search ................ 330/5, 5.5, 34, 61 A; 331/99, 107 R; 333/84 M

[56] References Cited

UNITED STATES PATENTS 3,648,185 3/1972 Acket et al. .......................... 330/5

3,721,919 3/1973 Grace ............................ 333/84 M 3,743,967 7/1973 Fitzsimmons et al. .......... 330/34 X

*Primary Examiner*—John S. Heyman

*Attorney, Agent, or Firm*—Edward J. Norton; Joseph D. Lazar; Donald E. Mahoney

[57] ABSTRACT

A transmission line circuit provides broadband trapatt diode amplification. The circuit includes a plurality of constituent length pair combinations of substantially quarter-wavelength shorted and non-shorted transmission line sections which extend from a point of a common transmission line section across which the trapatt diode is shunt connected.

13 Claims, 9 Drawing Figures

BROADBAND TRAPATT DIODE AMPLIFIER

The invention herein described was made in the course of or under a contract with the Department of the Air Force.

BACKGROUND OF THE INVENTION

The present invention relates to microwave amplifiers and more particularly to wide band microwave amplifiers which utilize trapatt diodes.

Microwave amplifiers having power outputs exceeding 100 watts and bandwidths approximating 10 percent of their central frequency of operation are desirable for use, for example, in phased array radar systems. Prior art amplifiers of the type utilizing trapatt diodes, however, have generally been inadequate for this and other similar applications, since they have been charactersiticaly limited to bandwidths approximating 2–3 percent. While certain techniques, such as, for example, lump element LC staggar tuning have been successfully utilized for widening bandwidths of linear negative resistance device amplifiers, in general, these have sacrificed gain for increased bandwidth. With such structures, the gain bandwidth product remains essentially constant. Additionally, most prior art trapatt diode amplifiers are easily triggered into oscillation and have required somewhat critical tuning and delicate handling.

SUMMARY OF THE INVENTION

The novel trapatt diode amplifier includes a transmission line circuit means having a plurality of electricaly connected transmission line secitons of predetermined length along which microwaves propagate. The circuit means includes a common line section having a trapatt diode and an input output coupling means shunt connected intermediate thereto. Three or more furcate line sections are connected across and extend from the ends of the common line section. At least one furcate line section extends from each end thereof. A capacitive RF shorting means is provided for the furcate line sections which extend from one end of the common line section. The circuit means includes a plurality of substantially quarter wavelength shorted and non-shorted constituent length pair combinations of the transmission line sections which extend from the point of the common transmission line section cross which the trapatt diode is shunt connected. Various ones of the constituent length pair combinations cooperate to provide slightly differing predetermiend delays to propagating microwaves to provide a plurality of constituent amplification frequency peaks whereby broadbanding frequency amplification may be achieved.

DETAILED DESCRIPTION

Figures 1, 2:
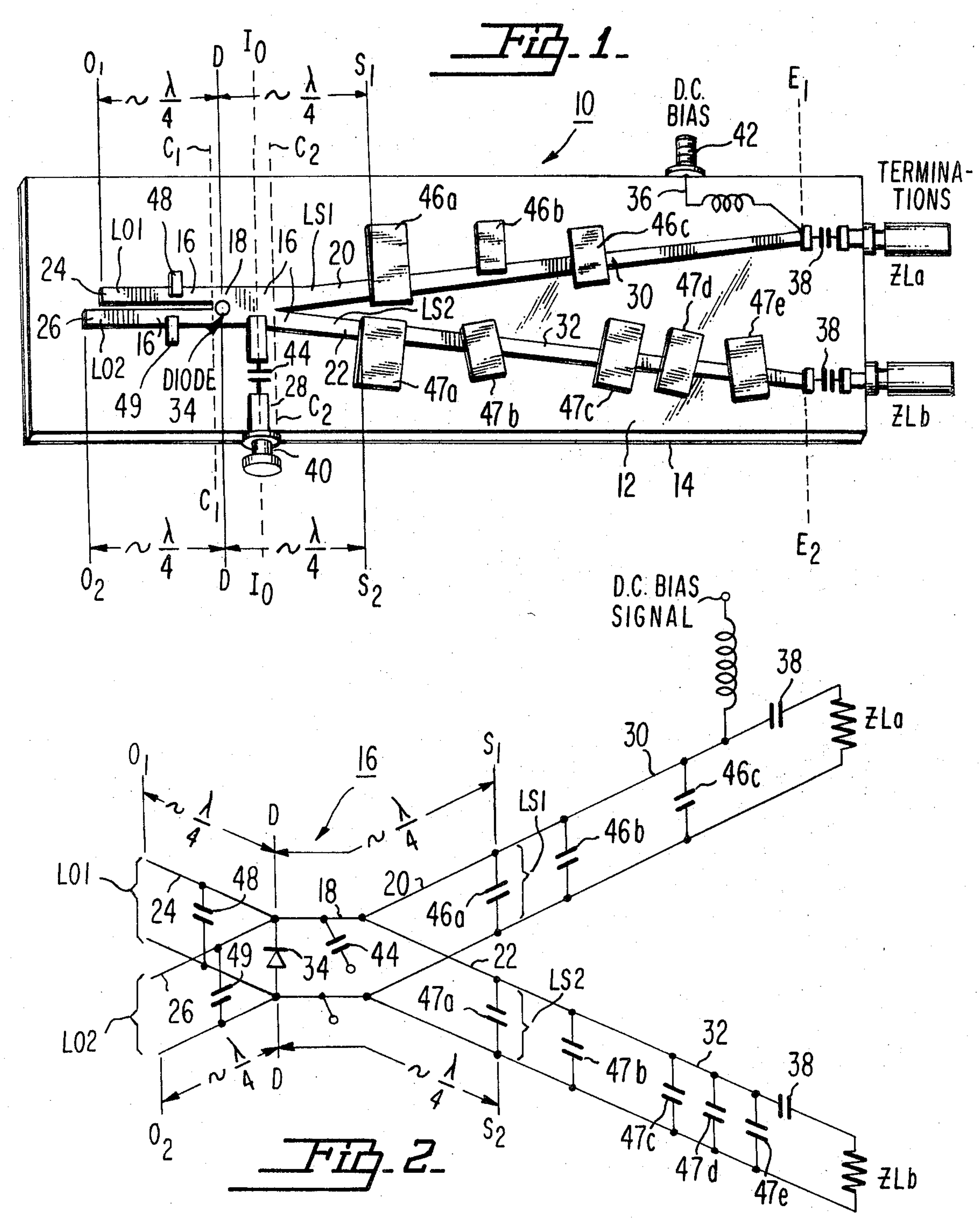
FIG. 1 is a perspective view of a microwave trapatt diode amplifier in accordance with the invention.
FIG. 2 is a schematic circuit representation of the microwave trapatt diode amplifier shown in FIG. 1.

Referring generally to FIG. 1, there is shown a broadband microwave trapatt diode amplifier 10. A microwave structure is provided which includes a dielectric sheet 12 of an electrically insulating material. A conductive coating 14 is provided on one of the major surfaces of the dielectric sheet 12. The other major surface of dielectric sheet 12 includes conductive strips 16. The conductive strips 16 comprise microstrips which act as one lead of a transmission line along which microwaves propagate.

The strips 16 and conductive coating 14 may, for example, consist of any conductive material; however, it is preferable that highly conductive materials, such as, for example copper or gold, be utilized. The dielectric 12 may comprise any of numerous dielectric which are insulators at microwave frequencies and is not otherwise considered critical. The microwave structure preferably comprises a material, such as, for example, copper clad "Duroid" available from Rogers Corporation, Rogers, Connecticut, consisting of a dielectric sheet of insulating material of teflon fiberglass having two copper clad major surfaces, and having an approximate dielectric constant ratio of 2.35.

In the manufacture of amplifier 10, material such as copper clad Duroid havng two conductive major surfaces may be etched on one of its major surfaces by photolithographic methods knwon in the semiconductive art, or otherwise prepared, to include the strips 16.

The conductive strips 16 include a plurality of interconnected strip sections, as hereinafter described, of various lengths. The respective physical lengths of each of the sections is designated parenthetically with a hyphenated letter-numeral designation symbolic of its respective end points which are shown with particularity in FIG. 1.

The conductive strips 16 include: a common strip section 18, ($C_1$–$C_2$); strip sections 20 ($C_2$–$S_1$) and 22 ($C_2$–$S_2$); strip sections 24 ($C_1$–$O_1$) and 26 ($C_1$–$O_2$); input and output strip 28 located intermediate the section 18 at point $I_o$; and interconnecting strips 30 ($S_1$–$E_1$) and 32 ($S_2$–$E_2$) extending from strips 20 and 22, respectively.

A trapatt diode 34 is shunt connected between the strip section 18 and the conductive coating 14, having its cathode connected to the intermediate point D of the strip section 18 and its anode connected to the conductive coating 14. Preferably, a heat sink mounting assembly is provided for the diode 34 (not shown) as part of the microwave apparatus which is sufficient to provide adequate heat dissipation, i.e., a proper heat sink, to avoid burn out of the diode caused by high power operation. One method of providing an adequate heat sink is, for example, disclosed in the *RCA Engineer*, for February–March 1973, at pages 36–37 in an article titled "High-efficiency avalanche diode (TRAPATT) for phased-array radar systems" and is herein incorporated by reference.

The trapatt diode 34 comprises an avalanche diode arranged in appropriate microwave circuit to operate in the anamalous mode of operation.

An avalanche diode operating in the anamalous mode, within an appropriate microwave circuit, it is two terminal non-linear negative resistance semiconductive device. An applied reverse signal, slightly greater than the breakdown voltage of the diode, will cause a displacement current or electric field in the depletion layer of the diode's semiconductive material. Carriers are created at the point of maximum electric field within the deplection layer. The carrier density is increased when the carriers collide with other atoms and create more carriers. The displacement current can also be considered as a wavefront, moving with a specific wave velocity, provided the displacement current has a very fast rise time. If the wave velocity of the displacement current is greater than the saturation velocity of the carriers, a high density of holes and electrons or carriers will be left in the wake of this wavefront. As a result of the concentration of holes and electrons, the electric field is reduced and the velocity of the carriers is diminished, leading to the formation of a dense plasma. Microwave energy is obtained from an avalanche diode by extraction of energy from the trapped plasma.

The necessary fast rise time of the displacement current can be achieved by utilizing the high frequency signals created by ionization at low currents. The high frequency signals trigger the avalanche diode into a high efficiency mode of operation, the anamalous mode. The avalanche diode then emits energy at a frequency which is related to the ratio of the deplection layer width to the velocity of the carriers in the plasma and the design of the complementary microwave circuitry.

Referring now to FIG. 1, a DC reverse bias signal is applied to the cathode of diode 34, through a biasing circuit that prevents the leakage of microwave energy into the DC bias power supply, not shown. Such a biasing circuit may be high inductance lead 36 that appears as an open circuit at microwave frequencies. The blocking capacitors 38 prevent the applied DC bias signal from coupling to the terminating load ZL*a* or ZL*b*. The magnitude of the applied DC bias signal is selected to be slightly less than the magnitude required to trigger diode 34 into generating microwave energy in the anamalous mode of operation as an oscillator; however, great enough to trigger such operation as an amplifier in response to the application of an input signal.

In the embodiment of FIG. 1, the strip sections 20 and 22 are provided with a RF short circuit means at their end points $S_1$ and $S_2$. Capacitive tuning plates 46a and **47*a* act as capacitors at RF microwave frequencies thereby providing a substantially short circuit termination for strips 20 and 22 at such frequencies at points $S_1$ and $S_2$. The plates 46*a* and 47*a* preferably comprise a strip of similar material as strips 16 having dimensions selected to provide a substantially short circuit to RF microwave signals propagating along sections 20 and 22. The size and shape of the tuning plates 46*a* and 47*a* may vary considerably without adversely affecting the operational performance of amplifier 10. The plates may be separately connected or attached to the strips 20 or 22 or may comprise an integral portion of the strips 16** formed by the photolithographic techniques previously described.

Strip sections 30 and 32 electrically interconnect the RF shorted ends of strip sections 20 and 22, respectively, at points $S_1$ and $S_2$, to the resistance terminations ZL*a* and ZL*b*.

Theoretically, microwaves propagating along the strip sections 20 and 22 are totally reflected by the RF short circuit accomplished by tuning plates 46a and 47a at points $S_1$ and $S_2$. However, not all propagating microwaves are necessarily reflected at the RF electrical ends $S_1$ and $S_2$ of the strips 20 and 22. For example, we have found that additional tuning plates such as **46*b*–46*c*, and 47*b*–47*e* may be interposed along the respective elongated lengths of the interconnecting strips 30 and 32. It has been found that the trial and error adjustment of these tuning plates 46*b*–46*c* and 47*b*–47*e*** permits an additional tuning of the bandwidth characteristics of the novel amplifier. Also, the additional tuning plates appear to permit greater ease and flexibility of adjustment as an amplifier than previously obtainable with prior art trapatt diode amplifiers.

The size, shape and placement of these additional tuning plates may vary considerably without substantially affecting the operational performance of the amplifier 10. The quantity of additional tuning plates and their relative positioning is established primarily by trial and error adjustment. The strip sections 30 and 32 also serve as an interconnecting means for the resistance terminations ZL*a* and ZL*b* to the RF electrical ends of strip sections 20 and 22 at points $S_1$ and $S_2$, respectively. The resistance loads ZLa and ZLb provide a resistance load termination for the considerably diminished RF energy (i.e., the RF energy not reflected by the tuning plates) which has propagated to the physical ends $E_1$ and $E_2$ of the respective strips 30 and 32.

The strip sections 24 and 26 are essentially non-terminated at their RF electrical ends at points $O_1$ and $O_2$, respectively. These non-terminated strips act substantially as "open circuit," or "non-shorted" transmission lines, to propagating microwaves. It has been found that the addition of small tuning plates such as 48 and 49 provide an additional capacitive tuning of the gain-bandwidth characteristics of the novel amplifier without introducing a substantial short circuit to microwaves propagating along the strip sections 24 and 26. The most desirable size and location of each of the tuning plates 48 and 49 along the respective elongated lengths of strips 24 and 26 is determined by trial and error adjustment.

Each of the descriptive terms "short," "open" and "non-short" as used herein, is intended to denote the RF electrically dominant effect of respective ones of said tuning plates on the various transmission line sections to propagating microwaves, and their meaning is not otherwise restricted.

Thus, the embodiment shown in FIG. 1 includes two short circuit strip sections 20 and 22 and two non-shorted strip sections 24 and 26 extending from the respective electrical ends of the common strip section 18. The strip sections 20, 22, 24 and 26 provide a forked or branched (i.e., "furcate") extension of the common strip section 18. A substantially straight elongated shape is provided for the strips 16 as a design expedient; however, numerous shapes and configurations may be utilized in lieu thereof. The lengths of strips 20, 22, 24, 18 and 26 are critical as hereinafter described.

Broadly, the strip sections 16, comprising strip sections 18, 20, 22, 24 and 26 provide a transmission line circuit means along which microwaves propagate, whereby broadband amplification operation of the amplifier is accomplishd, as hereinafter disclosed.

Referring now to FIG. 2, there is shown a schematic circuit representation of the embodiment of the novel amplifier shown in FIG. 1. The operation of the amplifier 10 may be most easily explained by considering the operation of constituent length pair combinations of shorted and non-short strip sections of the circuit means 16 which are connected across the trapatt diode 34 and each of which cooperates therewith to operate in a fashion similar to a single line narrow band trapatt amplifier.

The amplifier 10, represented schematically in FIG. 2, includes the RF short circuit strip sections LS1 and LS2 and RF non-short circuit strip sections LO1 and LO2. Strip section LS1, LS2, LO1, LO2 have slightly differing RF electrical lengths corresponding to the various elongated lengths of strip sections 16, shown in FIG. 1, extending from the diode placement D to points $S_1$, $S_2$, $O_1$ and $O_2$, respectively. The "Length pair combinations" herein disclosed comprise respective ones of said short circuit strip sections LS1 and LS2 in combination with respective ones of said non-short circuit strip sections LO1 and LO2. The operation of each of the respective length pair combinations LS1–LO1, LS2–LO1, LS1–LO2, and LS2–LO2 in the trapatt diode amplifier circuit of FIG. 1 may be simplified for explanation to a plurality of constituent single line trapatt diode amplifier circuits such as depicted in FIG. 1. Each of the strip sections LS1, LS2, LO1 and LO2 has an elongated RF electrical length which is substantially a quarter wavelength. More particularly, each of these sections is of an elongated length X of substantially: $X = \lambda/4 - YdVp,/4$, where $V_p$ is the phase velocity of the propagating microwave signals, $\lambda$ equals the quotient of the phase velocity $V_p$ divided by the trapped plasma frequency of operation of the trapatt diode associated with a particular length pair combination, and Yd is the response time exhibited by a typical avalanche diode in achieving operation.

In the operation of amplifier 10, a microwave signal is introduced at the input output strip section 28 by means of connector 40. The strip section 28 includes RF coupling means such as, for example, the capacitor 44, or an appropriate bandpass filter in lieu thereof, to permit the introduction of a propagating RF microwave input signal to the circuit defined by the strips 16.

Figure 3:
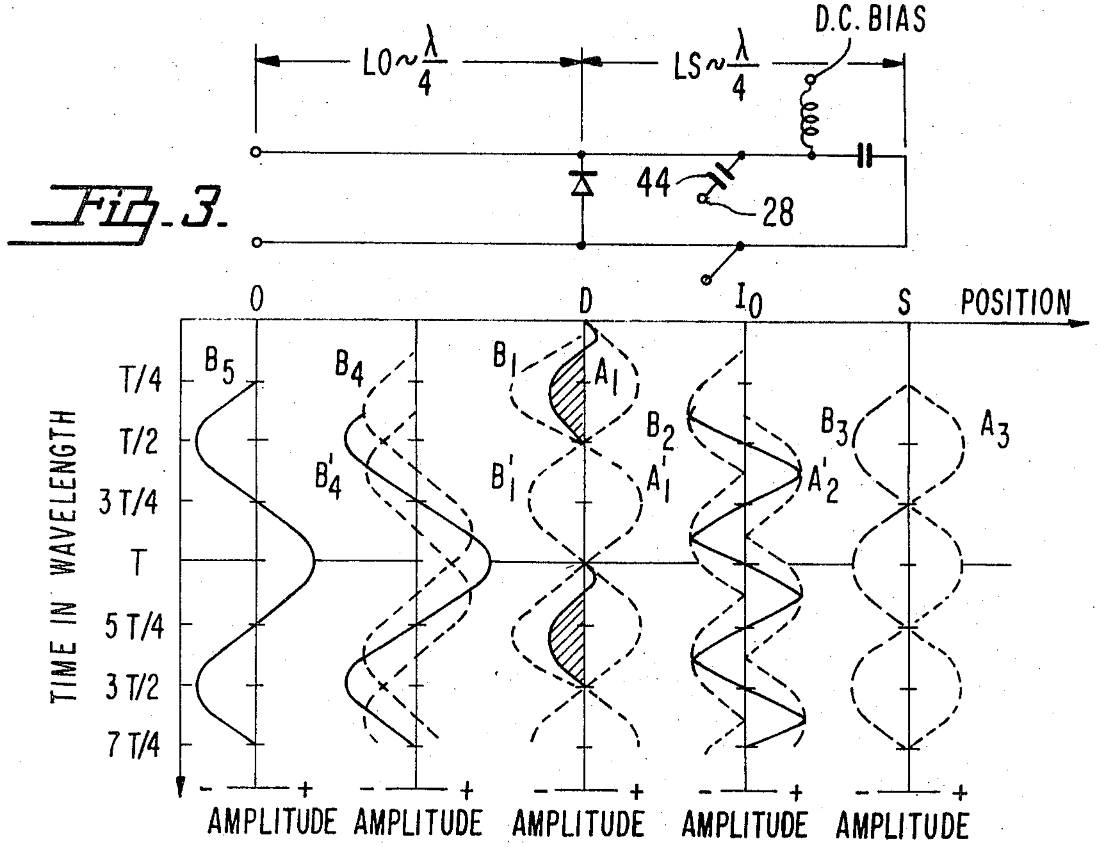
FIG. 3 is a simplified schematic circuit representation of one of the constituent tuned length pair combinations of transmission line sections of the amplifier of FIGS. 1 and 2 showing the respective RF waveforms obtained by time domain analysis at various points along the elongated lengths of various transmission line sections.

Referring now particularly to FIG. 3, waveforms are shown which represent the operation of each of the constituent length pair combinations which constitute the circuit defined by the strips 16, and which are constructed, using time domain analysis, for the extraction circuit shown. Specific waveforms are shown at respective points of the circuit depicted. T represents the time period of the fundamental wavelength (i.e., the reciprocal of the trapped plasma frequency). Long dashed lines depict the incident waves to each observation point, short dashed lines the reflected waves, and solid lines the resultant waveforms which would be observed on a sampling oscilloscope. Cross-hatched portions represent the occurrences of the trapped plasma. It is assumed, first, that a positive wave $A_1$ is incident on the diode, which induces a negative wave $B_1$ through the trapped-plasma process. The resultant response of the diode is the sum of $A_1$ and $B_1$, which is shown as a solid curve. The negative $B_1$ generated at the diode propagates in two direction. Part of $B_1$ propagates toward the RF short-circuit end (S), forming successively halfsine waves $B_1$–$B_2$–$B_3$. The transit time is T/4, since the distance from D to S is approximately one-quarter wavelength. The short-circuit end S reflects a positive $A_3$. $A_3$ propagates back toward D, forming $A_3$–$A_2'$–$A_1'$, also taking a transit time of T/4. On the other hand, part of $B_1$ propagates toward the RF open end (O), reflects at O without reversing the polarity, and returns to D, forming $B_1$–$B_4$–$B_5$–$B_4'$–$B_1'$. The travel takes a time T/2, since the roundtrip distance from D to O is approximately one-half wavelength. The diode D, therefore, receives both the positive $A_1'$ and negative $B_1'$ during the period of $t = T/2$ to T. These two waves cancel each other, and thus do not activate the diode. The resultant diode response remains almost flat during the second half of the fundamental period. Tracing the waves which travel back and forth in this way, all the waveforms can be constructed. The solid lines represent the sum of two waves travelling in opposite direction with respect to each other. In the circuit shown, the output line 28 is connected to a point $I_o$ between the diode and the leading edge of tuning plate which has a nearly sinusoidal second-harmonic signal of the trapped plasma frequency of diode 34. This point is an ideal position to pick up the second-harmonic signal. With the extraction point chosen as $I_o$, experimental results have shown that modifying an oscillator to operate as an amplifier is easier for the present circuit than for previously utilized second harmonic circuits. The nearly sinusoidal waveform at the extraction point $I_o$ facilitates the circuit tuning as an amplifier. Thus, input output coupling is preferably accomplished at point $I_o$ for the novel second harmonic amplifier shown; however other points may be utilized successfully depending upon the design and arrangement of the transmission line circuit in which the trapatt diode is operative and/or the relationship of the input frequency, the output frequency, and the trapped plasma frequency of operation of the trapatt diode.

In the operation of either the composite circuit of FIG. 2 or the constituent circuit of FIG. 3, the diode is reversed-biased as previously described. An RF microwave input signal which is a second harmonic of the trapped plasma frequency of the trapatt diode is introduced at the input and output terminal and a second harmonic RF output signal is extracted thereof.

Single line circuits similar to those represented by the constituent circuit illustrated in FIG. 3 have been previously used to obtain gains of 10db and bandwidths of 70 MHZ at frequencies of approximately 3 GHZ. We have found that by employing the novel composite trapatt diode circuit of FIG. 2, a gain bandwidth product in excess of three times that of the simplified constituent circuit of FIG. 3 can be attained for a similar central frequency of operation.

The novel composite trapatt diode circuit of FIG. 2 differs from the constituent circuit of FIG. 3 in that a plurality of length pair combinations of shorted (LS1, LS2) and non-shorted (LO1, LO2) strip sections are tuned to slightly differ trapped plasma frequencies of operation of the trapatt diode. The individual lengths of strip sections LO1, LO2, LS1 and LS2 are etched for example, as shown in FIG. 1 to have slightly differing elongated lengths. The respective electrical lengths of strip sections LO1, LO2, LS1 and LS2 are selected such that length pair combinations thereof: LO1 + LS1, LO1 + LS1, LO1 + LS2 and LO2 + LS2, each have a unique electrical length associated therewith substantially equal to $Z_1$, $Z_2$, $Z_3$ or $Z_4$, each of which is associated with a slightly differing trapped plasma frequency of operation of the trapatt diode whereby broadband operation of the composite circuit (approaching 10 percent) may be achieved, as hereinafter disclosed. In contrast, constituent circuits such as shown in FIG. 3 have limited bandwidths approximating 2–3 percent.

An operative embodiment of the novel trapatt diode microwave amplifier shown in FIG. 1 was constructed of copper clad "Duroid" consisting of a dielectric sheet of a0.076 cm. thick teflon-fiberglass material having two copper clad major surfaces, each of which was approximately 0.001 cm. thick and havine a dielectric constant ratio of approximately 2.35. The preferred construction herein previously described was utilized in which the critical lengths of the strips 16 were selected as follows.

LO1 = 2.6 cm.
LO2 = 2.8 cm.
LS1 = 2.4 cm.
LS2 = 2.7 cm.

Other less critical length dimensions were selected as follows:

$C_1$–$O_1$ = 2.1 cm.
$C_1$–$O_2$ = 2.3 cm.
$C_2$–$S_1$ = 1.3 cm.
$C_2$–$S_2$ = 1.6 cm.
$S_1$–$E_1$ = 14.8 cm.
$S_2$–$E_2$ = 14.8 cm.
D–$I_o$ = 0.4 cm.

The respective widths of the various sections in a direction perpendicular to their elongation were approximately as follows:

Section 18 ($C_1$–$C_2$) = 0.65 cm
Section 20 ($C_2$–$S_1$) and 22 ($C_2$–$S_2$) = 0.3 cm.
Section 24 ($C_1$–$O_1$) and 26 ($C_1$–$O_2$) = 0.25 cm.
and input output strip 28 = 0.3 cm. wide.

Tuning plates 46*a*–46*c*, 47*a*–47*e*, 48 and 49 were formed of a copper material having a substantially rectangular cross-section approximately as follows:

| Tuning Plate | Approximate Dimensions |
|---|---|
| 46*a*, 47*a* | 1.8 cm. × 1.0 cm. |
| 46*b*–46*c*, 47*b*–47*e* | 1.7 cm. × 0.9 cm. |
| 48 | 0.3 cm. × 0.1 cm. |
| 49 | 1.1 cm. × 0.3 cm. |

Figures 4A, 4B, 4C, 4D, 4E:
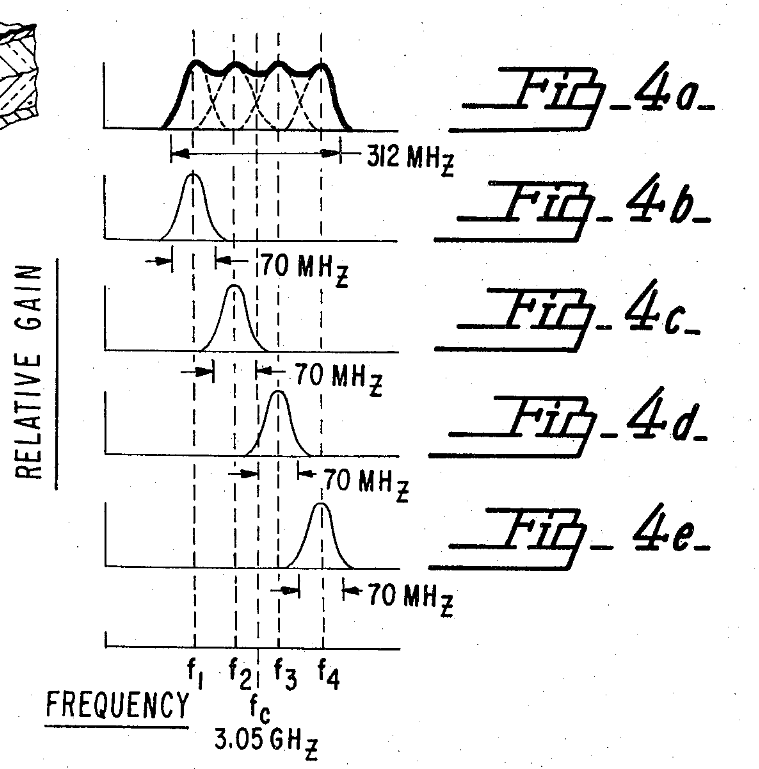
FIGS. 4*a*–4*e* are gain bandwidth diagrams comparing the gain bandwidth characteristics of each constituent length pair combination of the amplifier which act in a similar fashion as a single line trapatt diode amplifier, with the composite gain bandwidth characteristics obtained in accordance with the invention.

Referring to FIG. 4A, a gain of 8.74db was achieved for this embodiment having a bandwidth of 312 MHZ at a central frequency of operation of approximately 3.05 GHZ. Assuming that the typical bandwidth response for the single line circuit shown in FIG. 3 applies, it is theorized that the constituent length pair combinations LO1–LS1, LO2–LS1, LO1–LS2, and LO2–LS2 cooperate to provide a slightly differing but predetermined delays to the propagating microwaves whereby "broadbanding" frequency peaks are accomplished at frequencies $f_1$, $f_2$, $f_3$ and $f_4$ respectively (FIGS. 4*b*–4*e*) to form the composite waveform shown in FIG. 4*a*. While terminations Z*La* and Z*Lb* were selected to be 50 ohms, other resistive loads may be used. The tuning plates 46*b*–46*c*, 47*b*–47*e*, 48 and 49 (along the elongated length of strips 30, 32, 24 and 26) were tuned by trial and error to achieve optimum gain-bandwidth response.

Figure 5:
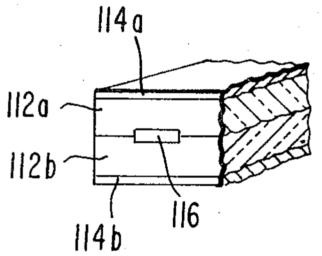
FIG. 5 shows a typical strip line construction.

The novel trapatt diode amplifier herein disclosed is broadly illustrative of a broadbanding circuit means for trapatt diode amplifiers in general. It is theoretically possible to design a broadband trapatt diode amplifier such as that shown in FIGS. 1 and 2 in which 3 or more furcate transmission line sections extend from a common transmission line section similar to 18, wherein at least one short circuit transmission line of a length substantially S and at least one non-shorted transmission line of length C is provided. The respective transmission line lengths may comprise any of the commonly known transmission lines such as coaxial or strip line constructions such as shown in FIG. 5 as well as the microstrip construction herein disclosed. In the case of the strip line construction, the conductive strips 116 (FIG. 5) may be disposed in a laminated structure between two layers of insulating dielectric 112*a* and 112*b*, the outer major surfaces of which include a conductive material 114*a* and 114*b*.

Therminology such as "line section" or "strip section" is utilized herein solely as a physical description of various portions of the novel transmission line circuit means and is not intended to denote physical or electrical separation or individual isolation of the respective "sections."

The term "furcate" is intended to be broadly descriptive of one or more branched or forked sections extending from the ends of a common section, such as 18, without regard to their respective shape or arrangement relative to the shape or elongation of that common section.

Modifications of the transmission circuit means may be designed in which amplification is accomplished for the fundamental trapped plasma frequency or harmonics thereof by persons skilled in the art. Accordingly, suitable adjustments in the location of the input and output coupling means may be accomplished to extract the harmonic signal desired.

We claim:

1. A microwave trapatt diode amplifier operative over a desired band of microwave frequency, comprising:
   a. transmission line circuit means having a plurality of electrically connected transmission line sections of predetermined RF electrical length along which microwaves propagate including:
      1. a common line section having a first and a second end,
      2. three or more furcate line sections electrically connected across and extending from the ends of the common line section, at least one of said furcate line sections extending from each end thereof,
      3. RF shorting means for shorting the furcate line sections extending from the first end of said common line section;

b. a trapatt diode electrically shunt connected across said common line section at an intermediate point along its sectional length,
c. input and output coupling means electrically shunt connected across said common line section at an intermediate point along its sectional length for respectively introducing a microwave input signal and extracting an amplified output signal thereof,
d. resistance load connection means for each of said RF shorted furcate line sections,
e. means for introducing a bias signal across said trapatt diode,
f. said shorted and non-shorted sections forming constituent length pair combinations of substantially quarter-wavelength RF electrical lengths which extend from the intermediate point of connection of said trapatt diode to the RF electrical ends of various ones of said furcate line sections and along which said microwaves are confined to propagate, wherein various ones of said constituent length pair combinations cooperate to provide slightly differing predetermined delays to propagating microwaves to provide a plurality of constituent amplification frequency peaks whereby broadbanding frequency amplification may be achieved.

2. A trapatt diode amplifier in accordance with claim 1, additionally comprising: a laminated microwave strip line structure having:
a. two lamina of dielectric material each having facing and non-facing major surfaces thereon,
b. conductive strips interposed in lamina relation between said lamina of dielectric material and disposed on their respective facing major surfaces, and
c. a conductive coating on each of said non-facing major surfaces of said lamina of dielectric material, said conductive strips cooperating with said lamina of dielectric material and the conductive coatings to form said transmission line circuit means.

3. A trapatt diode amplifier in accordance with claim 1, additionally comprising: a microwave structure having:
a. a sheet of dielectric material with opposing major surfaces,
b. a conductive coating on one of said major surfaces, and
c. conductive strips on the other of said major surfaces, said conductive strips cooperating with said dielectric material and said conductive coating to form said transmission line circuit means.

4. A trapatt diode amplifier in accordance with claim 3, wherein said RF shorting means comprises conductive tuning plates electrically connected to said conductive strips.

5. A trapatt diode amplifier in accordance with claim 3, wherein said resistance load connection means includes:
a. a resistance load for each of said shorted furcate line sections, and
b. a length of conductive strip interposed between each resistance load and its respective shorted furcate line section extending, at one end, from the shorted end of the respective shorted furcate line section, and electrically connected to the resistance load at its other end.

6. A trapatt diode amplifier in accordance with claim 5, wherein each of said conductive strips of said resistance load connection means includes additional conductive tuning plates electrically thereto.

7. A trapatt diode amplifier in accordance with claim 3, wherein said input and output coupling means includes a conductive strip extending from said common line section.

8. A trapatt diode amplifier in accordance with claim 7, wherein the conductive strip of said input and output coupling means extends approximately orthogonally from said common line section.

9. A trapatt diode amplifier in accordance with claim 7, wherein said conductive strip of said input and output coupling means extends from said common line section at a point wherein propagating microwaves thereon form substantially a second harmonic RF signal of the trapped plasma frequency of operation of said trapatt diode.

10. A trapatt diode amplifier in accordance with claim 3, wherein said non-shorted furcate line sections include a capacitive gain-bandwidth tuning means.

11. A trapatt diode amplifier in accordance with claim 10, wherein said capacitive gain-bandwidth tuning means comprises conductive tuning plates electrically connected along the sectional length of various ones of said non-shorted furcate line sections.

12. A microwave trapatt diode amplifier operative over a desired band of microwave frequencies, comprising: a lamina microwave structure having:
a. a sheet of dielectric material with opposing major surfaces,
b. a conductive coating on one of said opposing major surfaces,
c. a microstrip circuit means comprising a plurality of interconnected conductive strip sections on the other of said major surfaces including:
i. an elongated common strip section,
ii. three or more elongated furcate strip sections extending from the ends of said common strip section, at least one of said furcate strip sections extending from each end thereof,
iii. capacitive RF shorting means for shorting at least one of said furcate strip sections to said conductive coating at a point along its elongation,
iiii. resistance load connection means for each of said shorted furcate strip sections,
d. a trapatt diode shunt connected between an intermediate point along the elongation of said common strip section and said conductive coating,
e. RF blocking means for introducing a bias signal across said trapatt diode,
f. input and output coupling means to said common strip section including a strip section extending from an intermediate point along the elongation of said common strip section for respectively introducing a microwave signal and extracting an amplified signal thereof; and
g. substantially quarter wavelength combined elongated lengths of the strip sections consisting of various individual combined length portions of said furcate and common strip sections along which said microwaves are confined to propagate extending from said intermediate connection point for said trapatt diode; said quarter wavelength combined elongated strip sections being of slightly differing RF electrical lengths wherein length pair combinations of various ones of said combined strip sections which are shorted with various ones of said combined strip sections which are non-shorted cooperate to provide predetermined slightly differing delays to said propagating microwaves to provide a plurality of constitient amplification frequency peaks whereby broadbanding frequency amplification may be achieved.

13. A microwave trapatt diode amplifier in accordance with claim 10, wherein the individual RF electric lengths Z of various ones of said length pair combinations is substantially $Z = \lambda/2 - Yd^{V}p/2$ and where $V_p$ is the phase velicity, λ is the quotient of the phase velocity divided by the trapped plasma frequency of operation of said trapatt diode uniquely associated with a particular length pair combination and Yd is the response time exhibited by a typical avalanche diode in achieving operation.

* * * * *

UNITED STATES PATENT OFFICE
CERTIFICATE OF CORRECTION

Patent No. 3,848,196 Dated November 12, 1974

Inventor(s) Hirohisa Kawamoto, Elmer Lawrence Allen, Jr. and Sherman Weisbrod

It is certified that error appears in the above-identified patent and that said Letters Patent are hereby corrected as shown below:

Col. 1, line 33, "electricaly" should read --electrically--

Col. 1, line 48, "cross" should read --across--

Col. 2, line 24, "dielectric" should read --dielectrics--

Col. 2, line 34, "havng" should read --having--

Col. 2, line 36, "knwon" should read --known--

Col. 3, line 5, "it is" should read --is a--

Col. 5, line 26, "disclosed" should read --described--

Col. 5, line 34, "FIG. 1" should read --FIG. 3--

Col. 7, line 5, "LO1 + LS1" should read --LO2 + LS1--

Col. 7, line 19, "havine" should read --having--

Col. 8, line 20, "C" should be --S--

Col. 11, line 6, "constitient" should read --constituent--

Signed and sealed this 22nd day of April 1975.

(SEAL)
Attest:

RUTH C. MASON
Attesting Officer

C. MARSHALL DANN
Commissioner of Patents and Trademarks

FORM PO-1050 (10-69)
3530 6|72

USCOMM-DC 60376-P69
★ U.S. GOVERNMENT PRINTING OFFICE : 1969 O—366-334